United States Patent [19]

Parshotam et al.

[11] Patent Number: 4,965,516
[45] Date of Patent: Oct. 23, 1990

[54] SYSTEM FOR DIGITIZING AND DISPLAYING ANALOG SIGNATURES OF INTEGRATED CIRCUITS

[75] Inventors: Mahesh Parshotam, Edmonds; Alan D. Howard, Bothell; Robert D. Traulsen, Seattle; James L. Pennock, Seattle; James W. Hoo, Seattle; Michael M. Masten, Everett, all of Wash.

[73] Assignee: Huntron Instruments, Inc., Mill Creek, Wash.

[21] Appl. No.: 200,011

[22] Filed: May 27, 1988

[51] Int. Cl.$^5$ ................... G01R 31/28; G01R 13/20
[52] U.S. Cl. ....................... 324/158 R; 324/73.1; 324/121 R
[58] Field of Search ............. 324/73 R, 121 R, 158 R, 324/158 T, 73.1; 371/25, 22.4; 364/481, 487

[56] References Cited

U.S. PATENT DOCUMENTS 3,991,302 11/1976 Danner .................... 364/481

Primary Examiner—Ernest F. Karlsen

[57] ABSTRACT

A semiconductor test instrument (12) provides an AC interrogating signal to an element under test, such as a single pin of an IC. Horizontal and vertical signals are developed and applied to a display (33) which produces an analog signature signal representative of the operating condition of the test element. The horizontal and vertical signals are converted to digital signals by an A-D converter (34) and stored in memory (39). An analog signature is also obtained from the same element as the test element but which is known to be good. The horizontal and vertical components of this signature are also converted into digital signals and stored in memory (42). The test and reference digital signals are then compared and those test digital signals which are different identified. The analog signatures corresponding to both the test and reference digital values are then reconstructed for display and superimposed, for viewing by an operator.

15 Claims, 6 Drawing Sheets

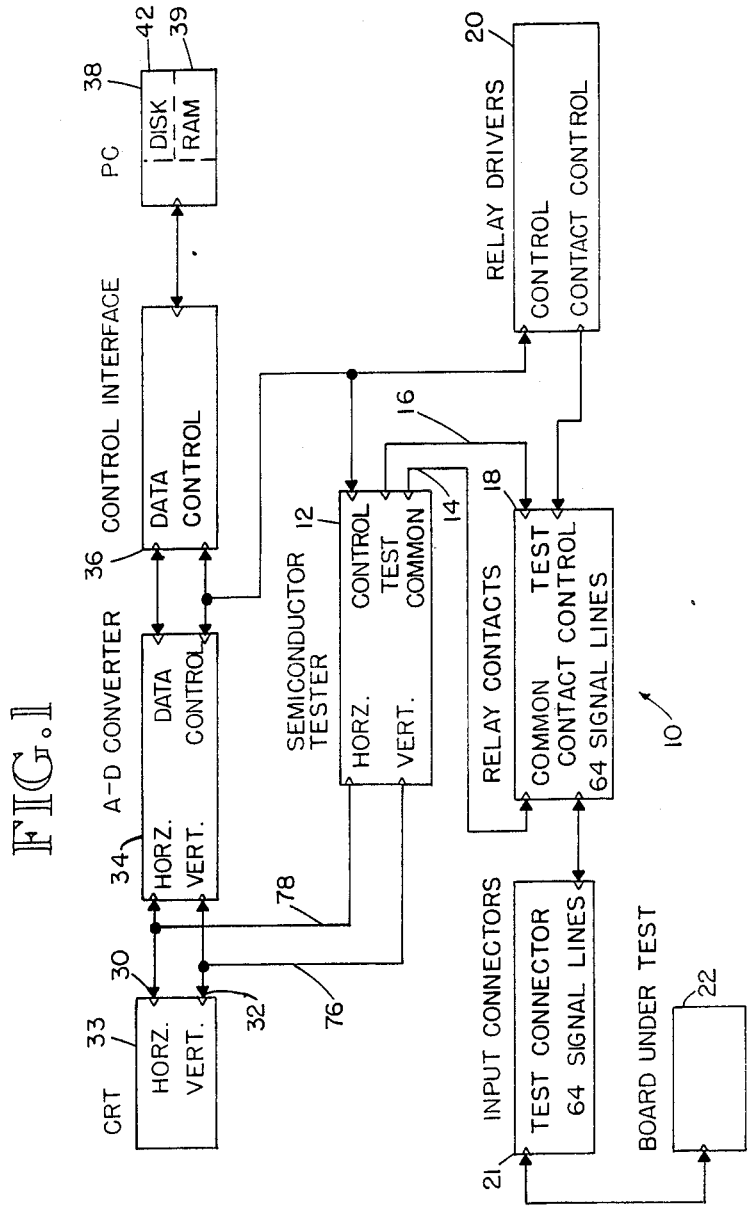

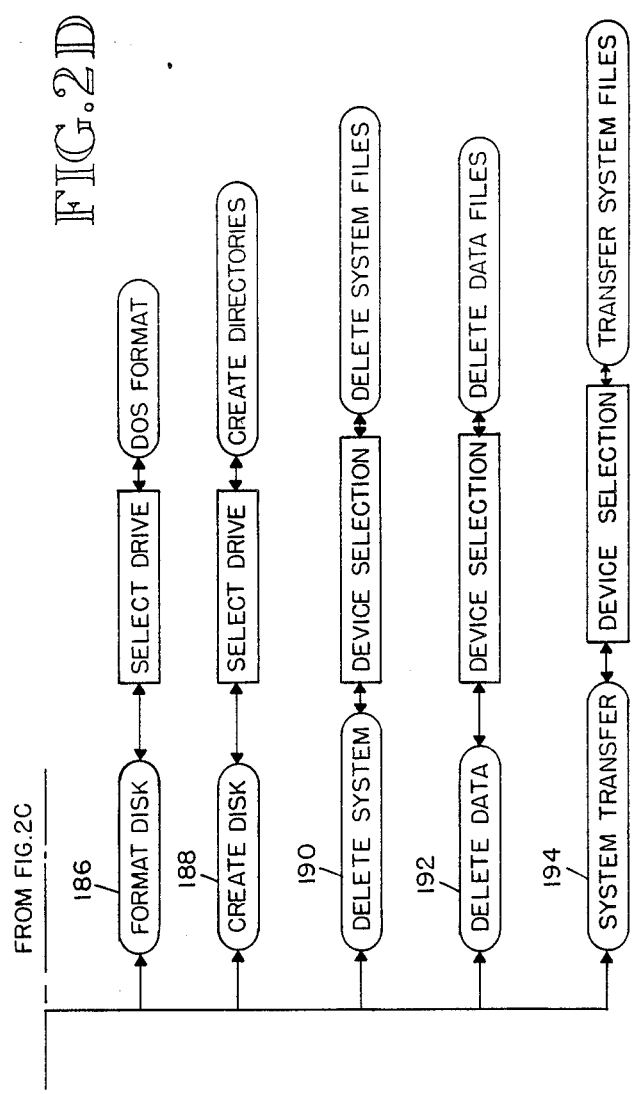

ns, necessitating that the element in question be connected again to the test instrument, in order that the analog signature be displayed In the present and still further development of analog signature analysis, full digitization, analog signature reconstruction, and particular display techniques and arrangements are used to further improve the operation and usefulness of the analog signature technique.

SYSTEM FOR DIGITIZING AND DISPLAYING ANALOG SIGNATURES OF INTEGRATED CIRCUITS

TECHNICAL FIELD

This invention relates generally to test equipment for integrated circuits and the like, especially test equipment which in operation produces an analog signature which is representative of the operating condition of selected circuit nodes or elements, such as pins or junctions, of the circuit, and more particularly concerns test equipment which digitizes the analog signature of a selected node for automatic comparison with reference digital information for the selected node, and then displays the test and reference digital information in analog signature form.

BACKGROUND ART

One important technique which has been developed to test the operation or functional status of semiconductor elements or the individual pins of integrated circuits is referred to as analog signature analysis. In the early development of this technique, the necessary electrical connections between the test instrument and the element/pin being tested were accomplished manually, such as by probes. An inspection of the resulting analog trace on the display of the test instrument was made by the operator, who determined the condition of the element based on his interpretation of the signature relative to a standard. The reliability of the test results thus depended to a significant extent on the skill and experience of the operator. This early development is exemplified by U.S. Pat. No. 3,973,198, issued on August 3, 1976, in the name of Bill Hunt, and U.S. Pat. No. 4,074,195 issued on February 14, 1978, also in the name of-Bill Hunt, both of which are owned by the assignee of the present invention.

In a further development of the analog signature analysis technique, a connection system was devised to automatically connect the test instrument sequentially to a plurality of test points, such as the successive pins in an integrated circuit, without any action required on the part of the operator. In addition in the further development, the analog signature signal obtained by the test instrument is converted into a set of digital signals which are representative of the analog value of the signature. These test digital signal values are then compared automatically with a previously stored reference set of digital values for the same element being tested. Operating under a selected protocol, any comparisons which yield a selected degree of differentness will be indicated to the operator.

The operator then can view those actual "different" analog signatures, following reconnection of the test instrument to the test points in question, to determine actual operating condition of the element. Alternatively, the element can be replaced on the basis of the results of the automatic comparison alone. Such an approach is exemplified by the structure shown in U.S. Pat. application Ser. No. 910,483 in the names of Yeung, et al., now U.S. Pat. No. 4,763,066 also owned by the assignee of the present invention, the contents of which are incorporated by reference herein.

However, even such further developments do not yield ideal results, since the automatic digital comparison is not completely accurate, and since the judgment of a trained operator is still important in many situa-

DISCLOSURE OF THE INVENTION

Accordingly, the present invention includes means for developing an analog signature signal which is representative of the operating condition of a selected element of an electronic circuit Means are included for converting the analog signature signal to test digital values and for storing the test digital values in memory. Means are also provided for developing and storing reference digital values for the same element as the selected element for which test digital values have been obtained and stored, wherein the element from which the reference digital values are obtained is known to be operating properly. A means is provided which is responsive to the test digital values and the reference digital values to reconstruct analog signatures therefrom which are substantially identical to the analog signatures obtained directly from the test element and the reference element. The analog signatures are then displayed for review by the operator.

BRIEF DESCRIPTION OF THE DRAWINGS

FIG. 1 is a block diagram showing the hardware elements of the apparatus of the present invention.

FIGS. 2A through 2D show a software flow chart for the present invention.

BEST MODE FOR CARRYING OUT THE INVENTION

Figure 2A:
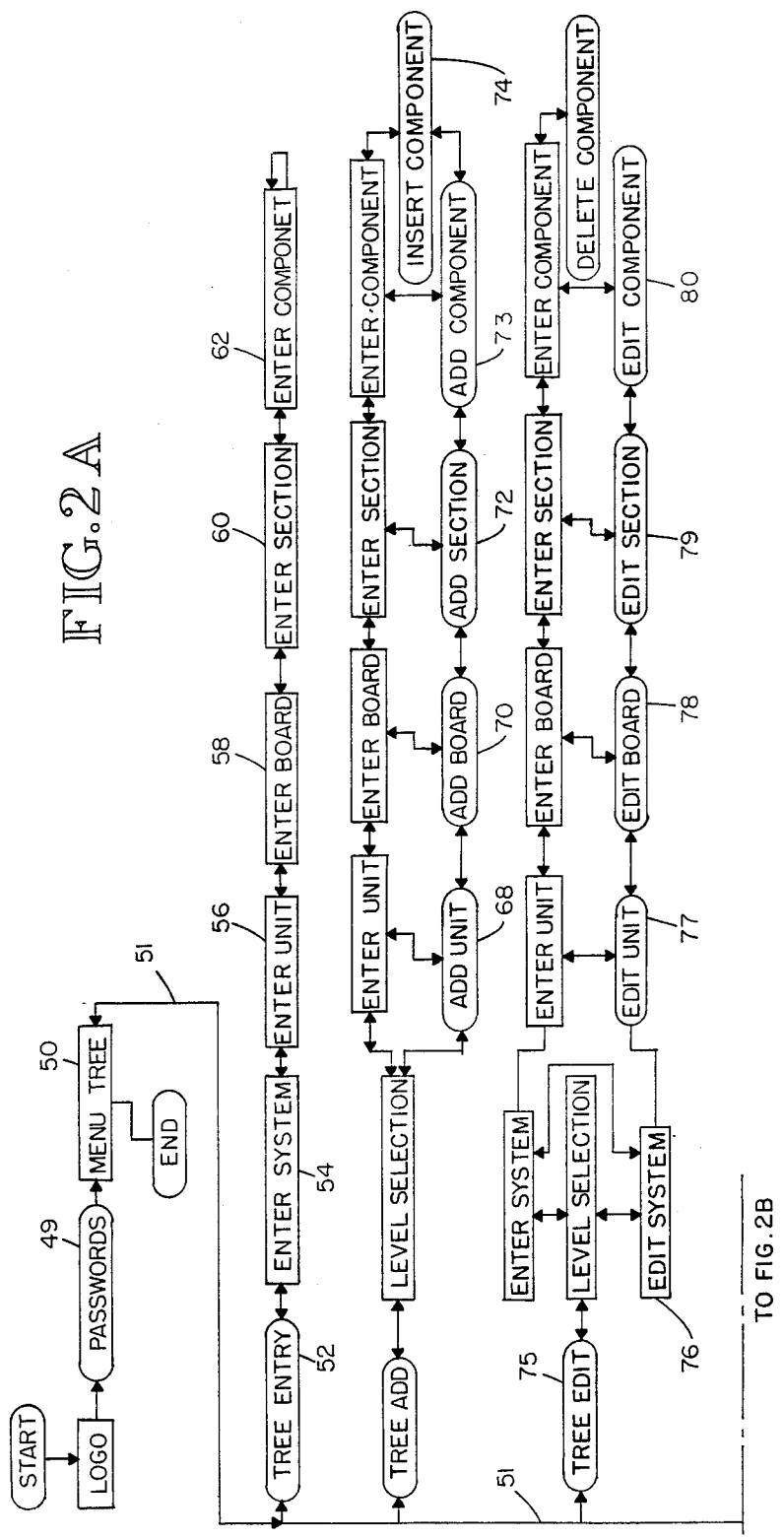
Figure 2B:
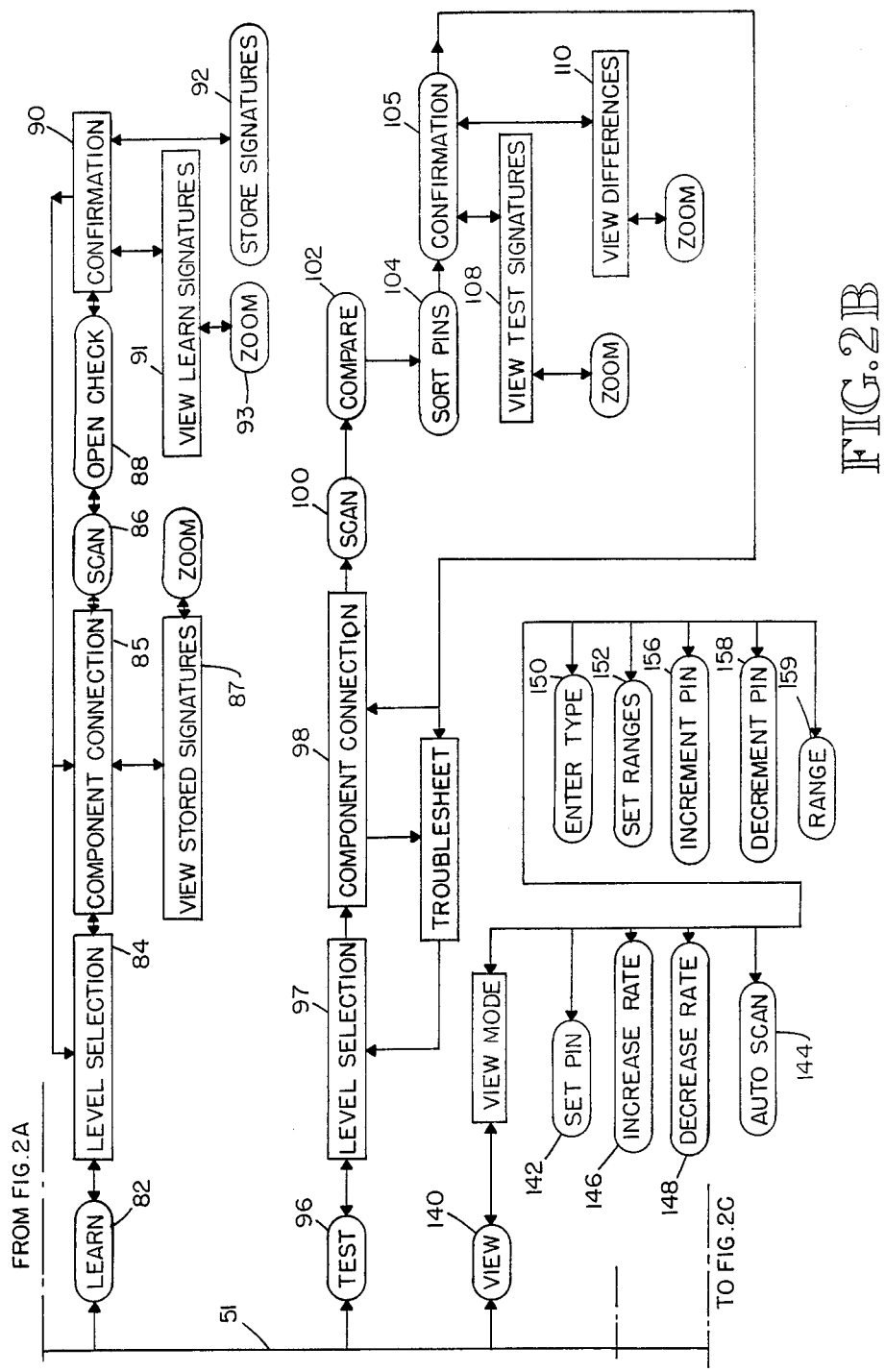

FIG. 1 shows a basic block diagram of the system of the present invention, which is designated generally at 10. A semiconductor test instrument is shown generally at 12 which is capable of producing the signals necessary for application to the element/pin under test, from which analog signals are developed to produce an analog signature for display on a CRT or the like which is part of the instrument. Such an apparatus is disclosed in the above-identified patents and patent application. Although the test instrument 12 is shown as a separate element in FIG. 1, it should be understood that in other system configurations, the test instrument 12 may be combined with the other elements shown in FIG. 1 and be in essence a single apparatus.

In operation, an AC electrical interrogating signal is applied from the test instrument 12 over lines 14 and 16 to a contact interface apparatus 18, which in the embodiment shown comprises a plurality of relays. The voltage and current levels for the interrogating signal may be selected from a number of different ranges, so that a correct interrogating signal is present for the particular element being tested. Again, examples of such ranges are disclosed in the above-identified patents and patent application.

The relays 18 are controlled by a set of relay drivers shown generally at 20. The relays control the application of the interrogating signal through a test connector element 21 to the actual device under test 22. Examples of test connections includes a 40 pin zero insertion force (ZIF) connector for dual-in-line (DIP) ICs, a 20 pin connector for connection to ICs having 20 pins or less, as well as 40 pin and 64 pin connectors. Additional signal line requirements could be accommodated if necessary by expanding the size of the connector element and the number of relays.

The signal response to the application of the interrogating signal to a particular test point, i.e. one selected pin in an IC, appears on lines 26, 28 from the test instrument and comprises a voltage signal which is the horizontal component of the to-be-developed analog signature, and a current signal which is the vertical component of the analog signature. These signals are applied respectively to the horizontal and vertical inputs 30 and 32 of a CRT 33, which is typically integrated into the semiconductor tester 12 itself. An analog signature is thus developed and displayed on the CRT. This is, however, conventional analog signature analysis technique, as described in detail in the above-identified patents and patent application.

The separate horizontal and vertical signals are applied to an analog-to-digital converter 34 which converts each of the horizontal and vertical signals to corresponding digital signals by sampling the analog signals relative to time. In the embodiment shown, the sampling rate is 50 microseconds, providing 100 samples for each cycle of the analog waveform. This rate could, of course be varied. What is important is that a direct or complete digitization of one cycle of the horizontal and vertical waveforms is accomplished, sufficient that the original analog signature can be substantially completely reconstructed from the digital information.

This digital information, referred to as the test digital information is then, in the embodiment shown, applied through a control interface circuit 36 to a personal computer (PC) 38 such as an IBM PC XT/AT or equivalent. In the PC 38, the test digital information is stored in RAM memory 39.

Previously, digital information for horizontal and vertical signals obtained from a component, such as an IC, known to be operating properly of which the element (i.e. pin) under test is a part, has been obtained and stored in permanent memory, such as disk magnetic media 42 in the PC 38. This information is referred to as reference digital information. The reference digital information is the standard for comparing the elements to be tested and is, as noted above, stored in memory prior to the testing of components in the actual use of the apparatus as a testing device. The application software in the PC which controls the above operations of the apparatus and the functions described hereinafter, will be described in more detail hereinafter.

Following the complete digitization of a cycle of the horizontal and vertical signals, as opposed to producing just a few digital signals representative of portions of the two signals, as is the case for the apparatus disclosed in the 483 application referred to above, a comparison is carried out between the test digital values and the reference digital values. If the differences, if any, between the test digital values and the reference values exceed a preselected amount (the tolerance), that element is "flagged" by the software as being "different".

In the embodiment shown, the tolerance is established by selecting a number relative to the reference value. Following all the element by element (pin by pin) comparisons for a particular component, the information for the "different" elements can be displayed, in a selected priority, typically beginning with the worse element, i.e. the element having the greatest difference relative to the reference information. Alternatively, the information for all of the elements can be displayed.

In this step, the analog signatures for both the test digital values and the reference digital values are reconstructed for display on the monitor of the PC 38, by applying the respective horizontal and vertical digital values to the monitor graphics generating section, which locates successive points and then connects the points with a continuous line.

The two analog signatures, one developed from the test digital values, the other developed from the reference values, are typically superimposed on the monitor, so that the operator sees, at the same time, on the same screen, an analog trace signature from the element being tested beneath a signature for an identical element known to be good, i.e. functioning within normal limits. Such an arrangement makes it significantly easier for the operator to see the differences between the "good" element and the element under test and thereby to determine the components which should be replaced, and/or what is wrong with a particular component, i.e. whether it is leaking, shorted, open, has a non-standard breakdown voltage, etc.

Although the two signatures in the embodiment shown are superimposed, with the "good" signature on top of the test signature, the two signatures may also be displayed alternatively, either automatically or under the control of the operator Such a system enables the technician to accurately provide prompt component evaluation without necessarily having a good board or component actually on hand, since the required reference information is already stored on permanent memory in the PC 38, and without having to reconnect the instrument to the particular element or elements which have been determined to be different to view their respective analog signatures on the CRT of the test instrument.

The flow chart for the software is shown in FIGS. 2A through 2D. Following startup and then entry and recognition of the password 49, a menu tree 50 is shown which permits the operator to select any one of the routines shown immediately to the right of the common line 51. There are three routines directed toward establishing the format or organization of information in the PC 38. The first of these is the tree entry routine 52. The tree entry routine permits the entry of the name or identification of the particular circuits to be tested.

The identification routine is divided into a hierarchy of five separate levels or identifiers. First, the system 54 is identified or named, indicating a complete apparatus, such as a personal computer. Then the unit 56 is identified. An example of a unit is a printer or a disk drive or some similar structure within the system. The board 58 includes an identification of a particular PC board within the unit, while the section 60 and the component 62 identify a circuit section of the board, i.e. a power supply, and a particular component of that section, i.e. one integrated circuit, respectively. Again, the tree entry routine provides the capability of completely identifying what is to be tested.

The tree add routine 64 accomplishes the adding of identifying information to an existing tree structure. In the tree add routine, information is first provided which identifies the correct tree and the correct location in the tree at which information is to be added. Then the desired information can be added. Additional unit, board and section information 68,70 and 72 are added to the existing lists at the ends thereof, while component information 73 can be added at the end of the existing list or can be inserted anywhere in the list. The add functions are carried out by the add routines 68, 70, 72 and 74. The actual lists can be viewed on the PC monitor (the screen) by the enter unit, enter board, enter section and enter component routines.

The tree edit routine 75 is similar to the tree add routine except it accomplishes the changing of information in the tree structure instead of adding information, as with the tree add routine 64. Associated with the tree edit routine 74 are an edit system step 76, an edit unit step 77, an edit board step 78, an edit section step 79 and an edit component step 80. Each of the above steps are associated with, and accomplished in conjunction with, the enter system, enter unit, enter board, enter section and enter component screen displays.

The learn routine 82 accomplishes the learning, i.e. obtaining, of digital reference information corresponding to the analog signature of each pin of each component of each board in the tree structure. The learn process can include the entire board, one or more sections thereof or only one or more components of selected sections. In the learn routine, there is first a level selection step 84, in which the desired position on the tree structure is identified. Then the particular component to be interrogated is connected to the test instrument at 85. Previously stored signatures for the said kind of component can be viewed with step 87.

The individual signatures of the elements of a component are then obtained by the test instrument; i.e. analog signature information (the horizontal and vertical signals) is obtained automatically via a scan routine 86 for each element. Then, this analog information is digitized. If desired, more than one of the same kind of component may be learned and the results stored to provide a practical range for acceptable performance.

In the next step 88, after scanning all the pins (elements of a particular component, i.e., a particular Ic, there is a review of the results to determine whether or not any of the pin connections are open. This information is helpful in determining whether the physical connection between the test instrument and the component is operating properly. The confirmation step 90 is an indication of opens/no opens, so that the learn routine may proceed.

The "learned" signature may then be viewed on the screen at step 91, so that the operator may determine whether or not to store the learned signature. The newly learned signature may be stored by the operator in step 92 in permanent storage. The stored information, as indicated above, is in digital form corresponding to the horizontal and vertical signals which comprise the analog signature when combined. A feature of routine 82, as well as other routines, is a zoom instruction or step 93 which increases the size of a selected signature. In the routine 82, the zoom feature can be selected either with respect to the previously stored signatures 87 or the newly learned signatures 91.

The test routine 96 is similar to the learn routine 82, except that in the test routine 96, after the component to be tested has been identified (selected) in its tree structure at 97 and connected to the test instrument at 98, the digital reference information which is in disk storage and which has been previously learned for that component is transferred to RAM storage in the computer 38.

The individual pins or junctions in the component are then scanned in step 100 and a comparison is made in step 102 between the test digital information and the reference digital information, as described in detail above. Following such comparison of all of the pins of a given component, the results are sorted, in the embodiment shown, in accordance with the extent of the differences, in step 104, with the greatest difference between the reference digital information and the test digital information being first in line. In one case the differences can be sorted relatively to the reference values themselves, or in another case, relative to the reference values and the established tolerance.

However, such a sort step need not be on a priority basis of greatest difference, but can be on other bases as well, such as the sequence of pins tested. The confirmation step 105 indicates the presence of differences as the component is scanned and tested. In the comparison step, the test digital information or values can be compared against an absolute reference standard, or against a range of values relative to the reference standard, i.e. within a selected tolerance or deviation relative to the actual reference values. The deviation can be set by the operator. Further, the deviation can be different for different pins.

A listing of the elements which are different, i.e. outside of the established range, can be printed out through a troublesheet step 106. The actual test signatures may be viewed on the monitor in step 108 or the test signature and the reference signature may be viewed superimposed in step 110, with the reference signature on top. It should be understood that an indication that the particular element or elements is different (i.e. outside of the established range) does not necessarily mean a failure. It is only a flag that the set tolerance has been exceeded.

Figure 3A:
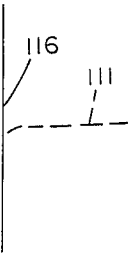
FIGS. 3A-3C show superimposed analog signatures produced by the apparatus of the present invention for a diode, as well as the horizontal and vertical signals for each signature.
Figure 3B:
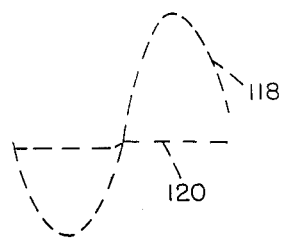
Figure 3C:
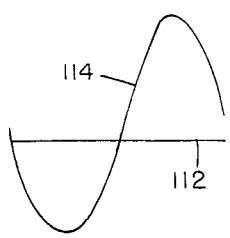

FIG. 3A shows one example of the screen display of superimposed signatures, while FIGS. 3B and 3C show, respectively, the horizontal and vertical signals for the test signature and the reference signature. The reference signature 111 in FIG. 3A is for a diode which is known to be functioning within an acceptable range. The horizontal and vertical signals which produce the signature 111 are shown in FIG. 3C. The horizontal (voltage) signal is shown at 112 while the vertical (current) signal is at 114. The signature of the test element is shown in FIG. 3A at 116. Referring to FIG. 3B, signature 116 is the result of combining the horizontal (voltage) signal 118 and the vertical signal 120. In FIG. 3A, the test signature 116 is clearly different than the reference signature 111, indicating that the test element is not functioning properly (in this case a shorted diode) and should be replaced.

Figure 4A:
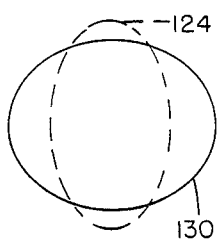
FIGS. 4A-4C shows diagrams similar to FIGS. 3A-3C for a capacitor.
Figure 4B:
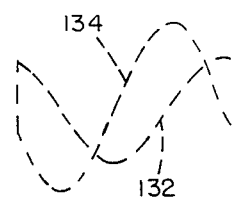
Figure 4C:
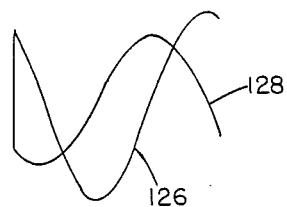

Another example is shown in FIGS. 4A–4C, which are signatures for a capacitor. The reference signature is shown at 124 in FIG. 4A, which is the result of the voltage and current signals 126 and 128 (FIG. 4C) which are applied to the horizontal and vertical graphics circuits, respectively, of the PC monitor. The test signature 130 is the result of combining voltage and current signals 132 and 134 (FIG. 4B). Again, the clear differences between the two signatures in FIG. 4A indicate that the test element is faulty (the capacitance is significantly different than it should be) and should be replaced.

A significant advantage of the present invention is the ability to superimpose analog signatures for the reference element and the test element. Such an arrangement makes it much easier for the operator to accurately determine the operating condition of the test element and identify, if necessary or desirable, the particular fault if there is one.

In the embodiment shown, the display on the monitor of test signatures or superimposed reference signatures is about the same size as the CRT display of the signature on the test instrument. This of course could be changed if desired. When the zoom feature is used, the superimposed occupy approximately 60 percent of the screen, at the very center thereof. In another feature of the invention, all of the signatures of a component may be viewed, whether or not they are different, i.e. outside the selected tolerance range. In this feature, a total of eight signatures are displayed on the screen at the same time. A different number of simultaneously displayed signatures could also be done. Also a plurality of just different signatures, or superimposed signatures, could also be displayed simultaneously.

Returning now to FIG. 2B, the next routine in the menu is known as the view routine 140. routine permits any particular pin or element in any particular component to be selected for manual viewing. In this routine, the test instrument is essentially being used manually and the analog signature of the element being tested appears on the CRT of the test instrument, and not the PC monitor, although the automatic connector apparatus described above is still operative.

In the view mode, a particular pin may be selected via step 142, or all the pins (elements) in a particular component can be scanned automatically at a selected rate through the auto scan step 144, following selection of the particular connector used in step 150, so that the correct scan reference may be increased or decreased through steps 146 or 148. The test ranges for the automatic scan may be selected in step 152. If the view routine is not in the autoscan mode, the particular pin (element) viewed may be incremented in step 156 or decremented in step 158. The range may be selected in step 159. As indicated above, the view routine permits the apparatus to operate in a manual type of mode, with or without an automatic scan, in which the test signature alone is shown on the CRT of the test instrument.

Figure 2C:
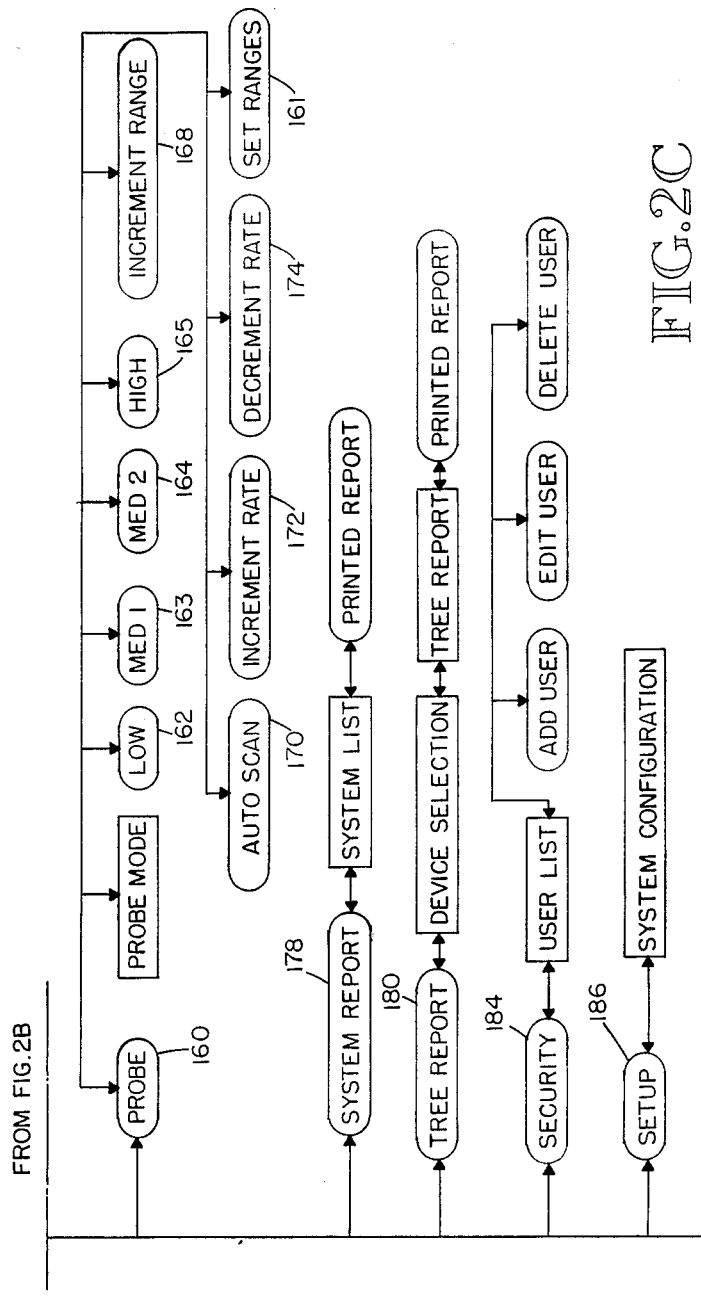

Referring now to FIG. 2C, the probe routine 160 is directed toward use of manual probes for connection by the operator to particular elements to be tested, as opposed to use of the connectors and relay system described above. In the probe routine, there is control over the test ranges of the instrument through various instructions. In the embodiment shown, there are four test ranges for the test instrument and these are selected by the operator through software control at step 161, including instructions to select the low range 162, the first medium range 163, the second medium range 164 and the high range 165. The range furthermore may be incremented by the increment range instruction 168. In addition, the ranges may be scanned automatically by step 170, with the rate of automatic range scan being increased by step 172 or decreased by step 174.

There are two report routines in the software of the embodiment shown, one a system report 178 and the other a tree report 180. The system report is a routine which simply provides a listing of the systems presently in permanent storage, i.e. those systems which have been learned and for which reference digital information is in memory. The tree report 180 provides all of the information in a selected tree structure, i.e. that information initially provided through the tree entry routine concerning a particular system, including identifying information about the unit, the board, the section and the component.

There are two routines for system utilities. The security routine 184 provides the passwords and the security levels for each of the selected users of the software. Further, it maintains the list of authorized users, and has the capability of adding or deleting users. The set up routine 186 includes error messages and other system housekeeping matters, including for instance the colors used on the monitor. In the embodiment shown, for instance, the two superimposed signatures in FIGS. 3 and 4 will be shown in different colors, for ease of comparison. Also, the horizontal and vertical signals comprising the signatures could be in different colors. However, the two signatures could be distinguished from each other by means other than color, such as line style and the like. One signature could be in dotted lines, for instance, while the other signature could be a solid line.

There are in addition five general file maintenance routines, shown in FIG. 2D, including the format disk routine 186, the create disk routine 188, the delete system routine 190, the delete data routine 192, and the system transfer 194. The format disk routine formats the floppy or hard disk so that the computer can write information to and from the disk storage. In the create disk routine, instructions are provided for actually organizing information on the disk media. In the delete system routine, all of the tree structure information concerning a particular system is deleted. The delete data routine deletes analog signature information from a system section, i.e. the power supply on a particular computer board. Lastly, the system transfer routine 194 includes instructions for transferring information from the hard disk to a floppy disk in the PC, which can then be moved to another test apparatus and loaded to hard disk memory in the particular PC associated with that test apparatus.

Hence, the present invention includes a test instrument which provides interrogating signals within a selected range to an element, such as a pin, junction or discrete component, and applies the resulting horizontal and vertical signals to a CRT for display as an analog signature, as well as applying the horizontal and vertical signals to an analog to digital converter. The digitized signals are then compared with previously stored digital information for a similar element known to be good, and then used to produce analog signatures, including superimposed signatures, for display and evaluation on the computer monitor. As part of this sequence, the differences between the test digital information and the reference digital information are compared against an established tolerance and then the so-called "different" signatures (outside of the pre-set tolerance) are identified and then prioritized for the superimposed display.

Although a preferred embodiment of the present invention has been disclosed herein for purposes of illustration, it should be understood that various changes, modifications and substitutions may be incorporated in such embodiment without departing from the spirit of the invention as defined by the claims which follow. For instance, the test instrument and connecting structure could be arranged so that more than one element (pin) could be learned or tested at one time. Also, actual signatures could be reproduced on the troublesheet, or a troublesheet could be constructed for a complete board. These board-level troublesheets, or troublesheets for multiple boards, could also be stored, for selective recall.

We claim:

1. An apparatus for developing, digitizing, and displaying analog signature information, comprising:
    means for developing an analog signature signal representative of the operating condition of a selected element of an electronic circuit;
    means for converting said analog signature signal to test digital values and storing said test digital values;
    means for developing and storing reference digital values for the same element as said selected element, wherein said same element is known to be operating properly;
    means responsive to said stored digital values and said reference digital values, respectively, to produce reconstructed analog signatures therefrom which are substantially identical to analog signatures obtained directly from said selected element and said same element; and
    means for simultaneously displaying said reconstructed signatures.

2. An apparatus of claim 1, including means for superimposing the displayed reconstructed signatures.

3. An apparatus of claim 1, including means for entering identifying information for a particular electronic circuit, including identifying information for systems, units, boards, sections and components comprising said circuit.

4. An apparatus of claim 1, including means for selectively changing the identifying information for said particular electronic circuit.

5. An apparatus of claim 1, including means for automatically comparing test digital values with reference digital values for all of the elements of a particular component in sequence.

6. An apparatus of claim 1, including means establishing a tolerance relative to said reference digital values and for indicating which test digital values are outside of said tolerance.

7. An apparatus of claim 5, including means for sorting those test digital values outside of said tolerance in accordance with a selected criteria.

8. An apparatus of claim 1, including means for storing the reference digital values in permanent memory, means for temporarily storing said test digital values, and means for transferring said reference digital values for a selected component from permanent memory to temporary memory when the selected component is to be tested.

9. An apparatus of claim 1, wherein the reference digital values and the test digital values are digital representations of the horizontal and vertical components of reference analog signatures and test analog signatures, respectively.

10. An apparatus of claim 1, including means for simultaneously displaying analog signatures for more than one element.

11. An apparatus of claim 1, including means for selectively enlarging the displayed analog signatures.

12. An apparatus of claim 2, wherein the test analog signature display and the reference analog signature display are differentiated visually relative to each other.

13. An apparatus for digitizing and displaying analog signature information which is representative of the operating condition of a selected element to be tested of an electronic circuit, comprising;
    means for converting analog signature information for said test element to corresponding test digital information, and storing said test digital information;
    means for storing reference digital information for said selected element, the reference digital information being from an element identical to said selected test element and which is known to be operating properly; and
    means for reconstructing analog signatures from said test digital information and said reference digital information and for simultaneously displaying said two analog signatures.

14. An apparatus of claim 13, wherein the test digital information and the reference digital information are digital representations of the horizontal and vertical components of the analog signatures for the test element and the reference element, respectively.

15. An apparatus of claim 13, wherein said two analog signatures are displayed superimposed.

* * * * *

UNITED STATES PATENT AND TRADEMARK OFFICE
CERTIFICATE OF CORRECTION

PATENT NO. : 4,965,516
DATED : October 23, 1990
INVENTOR(S) : Mahesh Parshotam, et al It is certified that error appears in the above-identified patent and that said Letters Patent is hereby corrected as shown below:

Title page:
Bill Hunt should be listed as a named inventor.

Signed and Sealed this

Twenty-fifth Day of February, 1992

Attest:

HARRY F. MANBECK, JR.

*Attesting Officer*  *Commissioner of Patents and Trademarks*